(12) United States Patent
Darda et al.

(10) Patent No.: US 12,272,467 B2
(45) Date of Patent: Apr. 8, 2025

(54) SEPARATION APPARATUS FOR HIGH-LEVEL NUCLEAR WASTE

(71) Applicants: Janak H Handa, Toronto (CA); Hossam Gaber, North York (CA)

(72) Inventors: Sharif Abu Darda, Oshawa (CA); Hossam Gaber, North York (CA)

(73) Assignees: Janak H. Handa, Toronto (CA); Hossam Gaber, North York (CA)

( * ) Notice: Subject to any disclaimer, the term of this patent is extended or adjusted under 35 U.S.C. 154(b) by 43 days.

(21) Appl. No.: 18/343,516

(22) Filed: Jun. 28, 2023

(65) Prior Publication Data

US 2024/0120122 A1  Apr. 11, 2024

Related U.S. Application Data

(62) Division of application No. 17/937,134, filed on Sep. 30, 2022, now Pat. No. 11,728,060.

(51) Int. Cl.

| | | |
|---|---|---|
| *G21F 9/06* | (2006.01) | |
| *B03C 1/033* | (2006.01) | |
| *B03C 1/28* | (2006.01) | |
| *G21F 9/30* | (2006.01) | |
| *H05H 1/30* | (2006.01) | |
| *G21C 19/46* | (2006.01) | |

(52) U.S. Cl.
CPC ............... *G21F 9/06* (2013.01); *B03C 1/0332* (2013.01); *B03C 1/288* (2013.01); *G21F 9/30* (2013.01); *H05H 1/30* (2013.01); *B03C 2201/18* (2013.01); *G21C 19/46* (2013.01)

(58) Field of Classification Search
CPC ...... H01J 49/328; B03C 1/023; B03C 1/0332; B03C 1/288; B03C 1/30; B03C 3/017; B03C 3/38; G21F 9/06; G21F 9/30; G21C 19/46
See application file for complete search history.

(56) References Cited

U.S. PATENT DOCUMENTS

| | | |
|---|---|---|
| 2,789,658 A | 6/1955 | Wintermute |
| 3,620,008 A | 11/1971 | Newbold |
| 4,110,086 A | 8/1978 | Schwab et al. |

(Continued)

FOREIGN PATENT DOCUMENTS

GB          1355714 A       6/1974

*Primary Examiner* — Joseph C Rodriguez
(74) *Attorney, Agent, or Firm* — Aird & McBurney LP

(57) ABSTRACT

A separation apparatus for separating a supply of high-level nuclear waste (HLW), where the HL nuclear waste is separated into high-mass and low-mass portions. The high-and-low mass portions of the HLW have respective atomic masses that are above and below an atomic mass cut-off point of the separation apparatus. The separation apparatus includes first and second ICP torches that are respectively mounted to and within an apparatus housing. The apparatus housing defines a cylindrical separation chamber and includes first and second magnetic elements which generate a magnetic field along the length of the separation chamber, and a plurality concentric ring electrodes which generate an electric field that is perpendicular to, and which crosses the magnetic field. The supply of HLW is subject to a mass separation process within the separation chamber using the set of crossed electric and magnetic fields.

13 Claims, 11 Drawing Sheets

(56) References Cited

U.S. PATENT DOCUMENTS

| | | | |
|---|---|---|---|
| 4,306,970 A | 12/1981 | Tanaka et al. | |
| 5,288,969 A | 2/1994 | Wong et al. | |
| 5,681,434 A | 10/1997 | Eastlund | |
| 6,322,706 B1* | 11/2001 | Ohkawa | H01J 49/328 210/512.1 |
| 6,787,044 B1* | 9/2004 | Freeman | H01J 49/328 210/243 |
| 6,797,176 B1* | 9/2004 | Ohkawa | B03C 1/023 210/243 |
| 6,956,217 B2* | 10/2005 | Ohkawa | B01D 59/48 210/695 |
| 8,182,754 B2* | 5/2012 | Yatsenko | B01J 3/008 588/20 |
| 9,121,082 B2* | 9/2015 | Marston | C22B 4/08 |
| 11,643,706 B2* | 5/2023 | Lee | C22B 59/00 423/21.1 |
| 11,728,060 B1* | 8/2023 | Darda | H01J 37/32669 588/20 |
| 2013/0118305 A1* | 5/2013 | Marston | C22B 4/08 75/10.67 |
| 2023/0352292 A1* | 11/2023 | Zhang | H01J 49/025 |

\* cited by examiner

SEPARATION APPARATUS FOR HIGH-LEVEL NUCLEAR WASTE

CROSS-REFERENCE TO RELATED APPLICATIONS

This application is a divisional application of U.S. patent application Ser. No. 17/937,134 filed on Sep. 30, 2022, the entire contents of which are incorporated by reference in this application, where permitted.

FIELD OF THE DISCLOSURE

The present disclosure relates generally to systems for separating supplies of high-level, radioactive waste. In particular, the disclosure relates to a separation apparatus for separating a supply of high-level nuclear waste into high-mass and low-mass portions.

BACKGROUND OF THE DISCLOSURE

The world's fossil fuels supply is running low, and this rising scarcity of fossil fuel will drive the construction of more nuclear power plants to support future energy demands. The construction of more nuclear power plants will in turn increase the global volume of high-level radioactive waste (also referred to as high-level nuclear waste, or HLW) that must be properly stored and disposed of. HLW is primarily composed of spent fuel removed from reactors after being used in the generation of electricity. Storing and disposing of an increasing volume of HLW is costly to maintain, and as such there is a need for a more permanent disposal method/site for HLW.

According to mass profile, spent fuel rods of HLW are about 3-4% fission products which are the most radioactive elements that contribute to 99.8% of the radioactivity by gamma and beta emission; the remaining 96-97% masses are actinides that contribute to long term and overall 0.2% radioactivity, mostly by alpha emission. Within HLW, a large amount of the mass of the storage volume is low or non-radioactive element, while the more-radioactive elements of the storage volume encompass a disproportionately low amount of the mass in comparison to their level of radioactivity. In general, lower mass fission products have a mass of 80-160 amu, whereas actinides have a mass of 225-250 amu and elements whose mass is <65 amu can be considered non-radioactive bulk elements. The volume of HLW which must be stored after its use in nuclear power generation could be significantly reduced by providing a process by which high-mass fission products (which makeup a small amount of the total mass of the HLW) could be separated from the low-mass bulk elements and actinides in the solid spent fuel and liquid of the HLW (which makeup a large amount of the total mass of the HLW).

It is therefore an object of the disclosure to provide a novel apparatus for separating a supply of high-level nuclear waste into high-mass, more radioactive portions and low-mass, less radioactive portions.

SUMMARY OF THE DISCLOSURE

According to an aspect, there is provided a separation apparatus for separating high-level nuclear waste into high-mass and low-mass portions with atomic masses above and below an atomic mass cut-off point, the apparatus comprising: a housing including an inlet end, an outlet end and a cylindrical separation chamber defined between the inlet end and the outlet end, the inlet and outlet ends each including a through-opening in fluid connection communication with the cylindrical separation chamber, the housing including sequential first, second and third axial housing sections which each surround a portion of the cylindrical separation chamber, an inner surface of at least one of the first, second and third axial housing sections including at least one first outlet aperture; first inductively-coupled plasma torch assembly being mounted to the inlet end of the housing and including an injection channel in fluid communication with the through-opening of the inlet end, the plasma torch being formed to inject a multi-species stream into the separation chamber via the through-opening of the inlet end, the multi-species stream including a partially ionized supply of the high-level nuclear waste and a plasma discharge; a second inductively-coupled plasma torch assembly including an rf (radio-frequency) coil circumferentially disposed around the second axial housing section, the rf coil being connected to a voltage source for energizing and further ionizing the partially ionized supply of the high-level nuclear waste within the cylindrical separation chamber; first and second magnetic elements circumferentially disposed around the first axial housing section and the third axial housing section, respectively, the first and second magnetic elements being positioned for generating a magnetic field that is substantially parallel to a longitudinal axis of the cylindrical separation chamber; and a plurality of concentric electrodes being mounted within the through aperture of the outlet end, an innermost electrode of the plurality of concentric electrodes defining a second outlet aperture, the plurality of concentric electrodes being connected to at least one external power source such that each of the plurality of concentric electrodes receives a unique electric potential from the at least one external power source for generating an electric field that is perpendicular to the magnetic field, the magnetic and electric fields being oriented along the separation chamber such that when the multi-species stream is injected into the separation chamber, the high-mass portion of the fluidized supply of high-level nuclear waste is ejected radially outwards towards the at least one first outlet aperture, and the low-mass portion of the fluidized supply high-level nuclear waste is directed along the longitudinal axis of the separation chamber, towards the second outlet aperture.

According to an additional aspect, the first inductively-coupled plasma torch of the separation apparatus is mounted to the inlet end of the housing and including an injection channel in fluid communication with the through-opening of the inlet end, the injection channel being formed to receive therethrough a multi-species input stream including a plasma forming gas and a nebulized supply of the high-level nuclear waste. The first inductively-coupled plasma torch includes a first rf coil which is disposed along the injection channel, and which is connected to at least one external power source for energizing the plasma-forming gas within the injection channel to form a plasma discharge as part of the multi-species stream.

BRIEF DESCRIPTION OF THE DRAWINGS

Embodiments will now be described, by way of example only, with reference to the attached Figures, wherein.

DETAILED DESCRIPTION OF THE EMBODIMENTS

Figure 1:
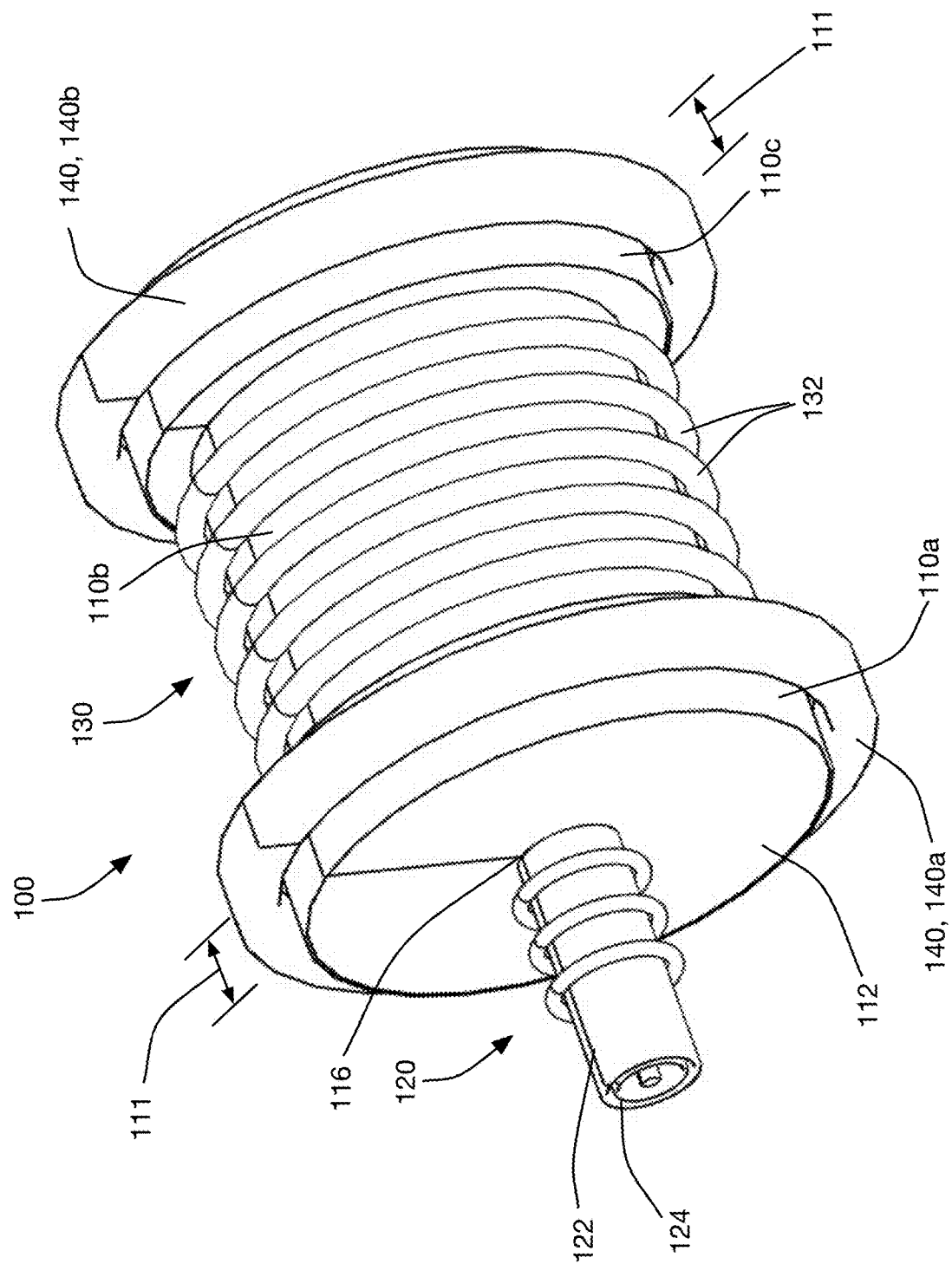
FIG. 1 shows an isometric view of an embodiment of the separation apparatus where the apparatus housing is a cylindrical apparatus housing.

For simplicity and clarity of illustration, where considered appropriate, reference numerals may be repeated among the Figures to indicate corresponding or analogous elements. In addition, numerous specific details are set forth in order to provide a thorough understanding of the embodiment or embodiments described herein. However, it will be understood by those of ordinary skill in the art that the embodiments described herein may be practiced without these specific details. In other instances, well-known methods, procedures and components have not been described in detail so as not to obscure the embodiments described herein. It should be understood at the outset that, although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described below.

Various terms used throughout the present description may be read and understood as follows, unless the context indicates otherwise: "or" as used throughout is inclusive, as though written "and/or"; singular articles and pronouns as used throughout include their plural forms, and vice versa; similarly, gendered pronouns include their counterpart pronouns so that pronouns should not be understood as limiting anything described herein to use, implementation, performance, etc. by a single gender; "exemplary" should be understood as "illustrative" or "exemplifying" and not necessarily as "preferred" over other embodiments. Further definitions for terms may be set out herein; these may apply to prior and subsequent instances of those terms, as will be understood from a reading of the present description. It will also be noted that the use of the term "a" or "an" will be understood to denote "at least one" in all instances unless explicitly stated otherwise or unless it would be understood to be obvious that it must mean "one".

Modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

The embodiments of the inventions described herein are exemplary (e.g., in terms of materials, shapes, dimensions, and constructional details) and do not limit by the claims appended hereto and any amendments made thereto. Persons skilled in the art will appreciate that there are yet more alternative implementations and modifications possible, and that the following examples are only illustrations of one or more implementations. The scope of the invention, therefore, is only to be limited by the claims appended hereto and any amendments made thereto.

Referring to FIG. 1, there is provided an embodiment of a separation apparatus 100 for separating a supply of high-level nuclear waste (HLW), where the HLW is separated into high-mass and low-mass portions. The high-mass and low-mass portions of the HL nuclear waste have respective atomic masses that are above and below an atomic mass cut-off point of the separation apparatus 100.

In the embodiment provided in FIGS. 1, 2, 4A and 4B, the separation apparatus 100 comprises an apparatus housing 110 including an inlet end 111, an outlet end 113 and a cylindrical separation chamber 410 defined between the inlet end 111 and the outlet end 113. The inlet and outlet ends 111, 113 of the apparatus housing 110 include respective through-openings 116, 214 which are in fluid communication with the separation chamber 410. The housing 110 includes sequential first, second and third axial housing sections (110a, 110b, 110c) which each surround a portion of the cylindrical separation chamber 410. In this embodiment of the housing, at least one of the internal surfaces (410a, 410b, 410c) of the first, second and third axial housing sections (110a, 110b, 110c) includes at least one first outlet aperture 414 through which the high-mass portions of the supply of HLW are collected.

The separation apparatus 100 also includes a first inductively-coupled plasma torch assembly 120 (first ICP torch 120) that is mounted to the inlet end 111 of the housing 110, and that includes an injection channel 124 in fluid communication with the through-opening 116 of the inlet end 111. The first ICP torch 120 is formed to inject a multi-species stream into the separation chamber 410 via the through-opening 116 of the inlet end 111, the multi-species stream including a partially ionized supply of the HLW, a plasma-forming gas and a plasma discharge.

The separation apparatus 100 also includes a second inductively-coupled plasma torch assembly 130 (second ICP torch 130) which includes a first rf coil 132 that is circumferentially disposed around at least a portion of the second axial housing section 110b. The first rf coil 132 is connected to at least one external voltage source for energizing and further ionizing the partially ionized supply of the HLW of the multi-species stream as it passes within the second axial housing section 110b of the cylindrical separation chamber 410.

The separation apparatus 100 also includes magnetic elements 140 in the form of first and second magnetic elements 140a, 140b. The first and second magnetic elements 140a, 140b are circumferentially disposed around the first axial housing section 110a and the third axial housing section 110c, respectively. The first and second magnetic elements 140a, 140b are positioned for generating a magnetic field that is substantially parallel to a longitudinal axis (L) of the cylindrical separation chamber 410.

Lastly, the separation apparatus 100 includes a plurality of concentric ring electrodes 250 that are mounted within the through aperture of the outlet end, where an innermost ring electrode 250a of the plurality of concentric electrodes 250 defines a second outlet aperture 252. The plurality of concentric ring electrodes 250 are connected to at least one external power source such that each of the plurality of concentric electrodes 250 receives a unique electric potential from the at least one external power source for generating an electric field that is perpendicular to the magnetic field. The magnetic and electric fields generated by the respective magnetic elements 140 and concentric electrodes 250 are oriented along the separation chamber 410 such that when the multi-species stream is injected into the separation chamber 410, the high-mass portion of the supply of HLW is ejected radially outwards towards the at least one first outlet aperture 414, and the low-mass portion of the supply HLW is directed along the longitudinal axis (L) of the separation chamber 410, towards the second outlet aperture 252.

In the separation apparatus 100 as provided herein, the plasma torches that are used to ionize and atomize the plasma forming gas and HLW are inductively-coupled plasma (ICP) torches. ICP torches are particularly appropriate for use in plasma systems that involve waste insertion and processing due to the high temperatures achieved by these ICP torches. The use of ICP torches is also advantageous in the separation apparatus 100 disclosed herein, because unlike direct-current plasma torches, ICP torches will not experience electrode erosion with prolonged use within the separation apparatus 100.

Referring to the embodiment of the separation apparatus 100 provided in FIGS. 1, 2, 4A, 4B, 5 and 6, the apparatus housing 110 of the separation apparatus 100 includes the inlet end 111, the outlet end 113 and the separation chamber 410 defined therebetween. In the embodiments provided in FIGS. 4A, 4B, and 6, the separation chamber 410 is a cylindrical separation chamber 410. The separation chamber 410 is defined within the apparatus housing 110 and is sized to receive the supply of high-level nuclear waste (HLW). Within the separation chamber 410, the supply of at least partially ionized HLW is subject to a mass separation process by means of the crossed electric and magnetic fields, where the crossed magnetic and electric fields act on the individual atoms of the plasma and the at least partially ionized supply of HLW.

In an embodiment such as in FIGS. 1 to 7, the apparatus housing 110 is a cylindrically shaped housing 110, where the separation chamber 410 is defined within the housing such that the separation chamber 410 is concentric with the cylindrical apparatus housing 110. The separation chamber 410 extends from the inlet end 111 to the outlet end 113 of the apparatus housing such that a longitudinal axis (L) of the cylindrical separation chamber 410 extends in a substantially horizontal orientation.

Figure 2:
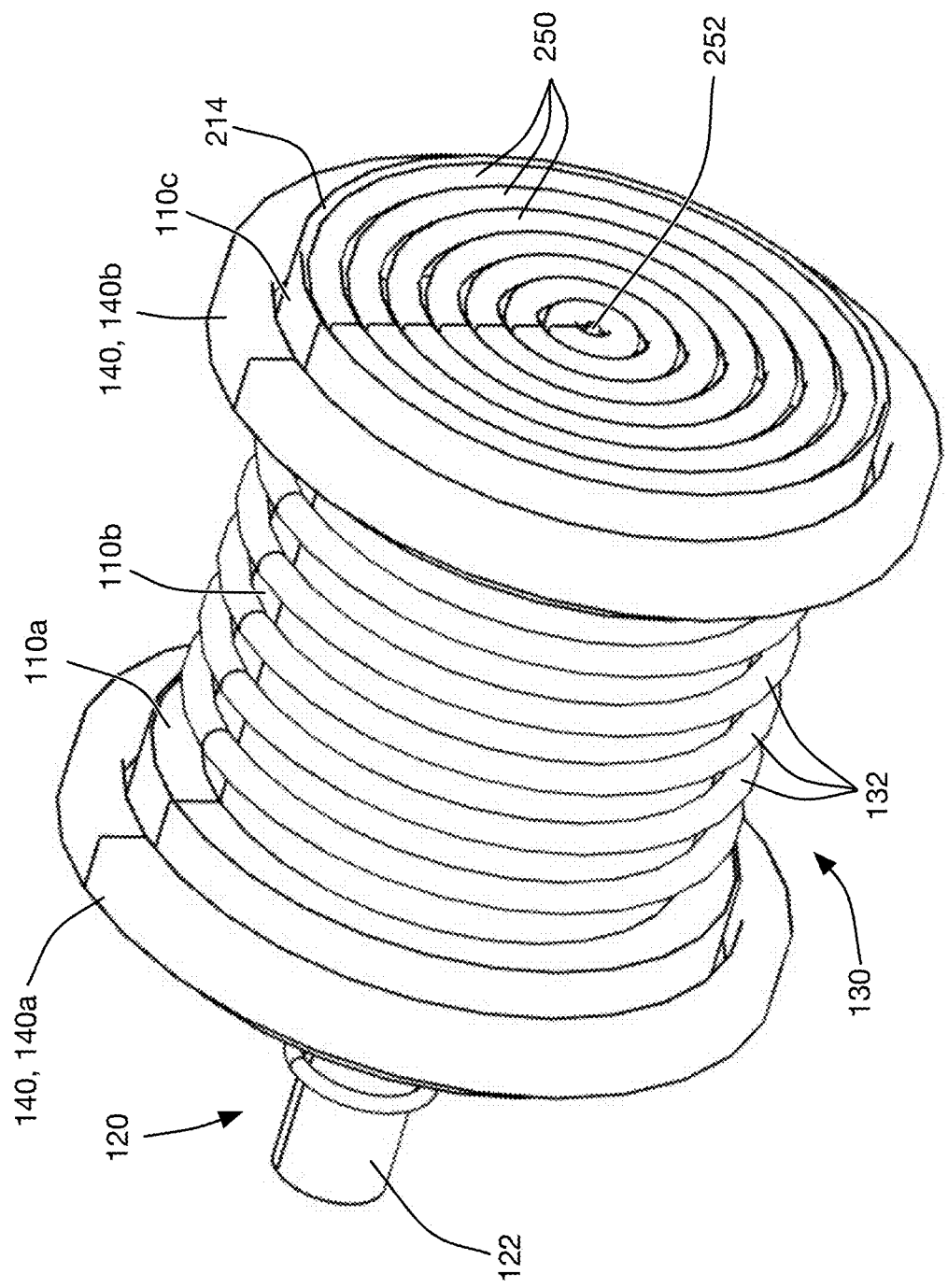
FIG. 2 provides a rear, perspective view of the separation apparatus in FIG. 1, including the plurality of concentric ring electrodes.
Figure 4A:
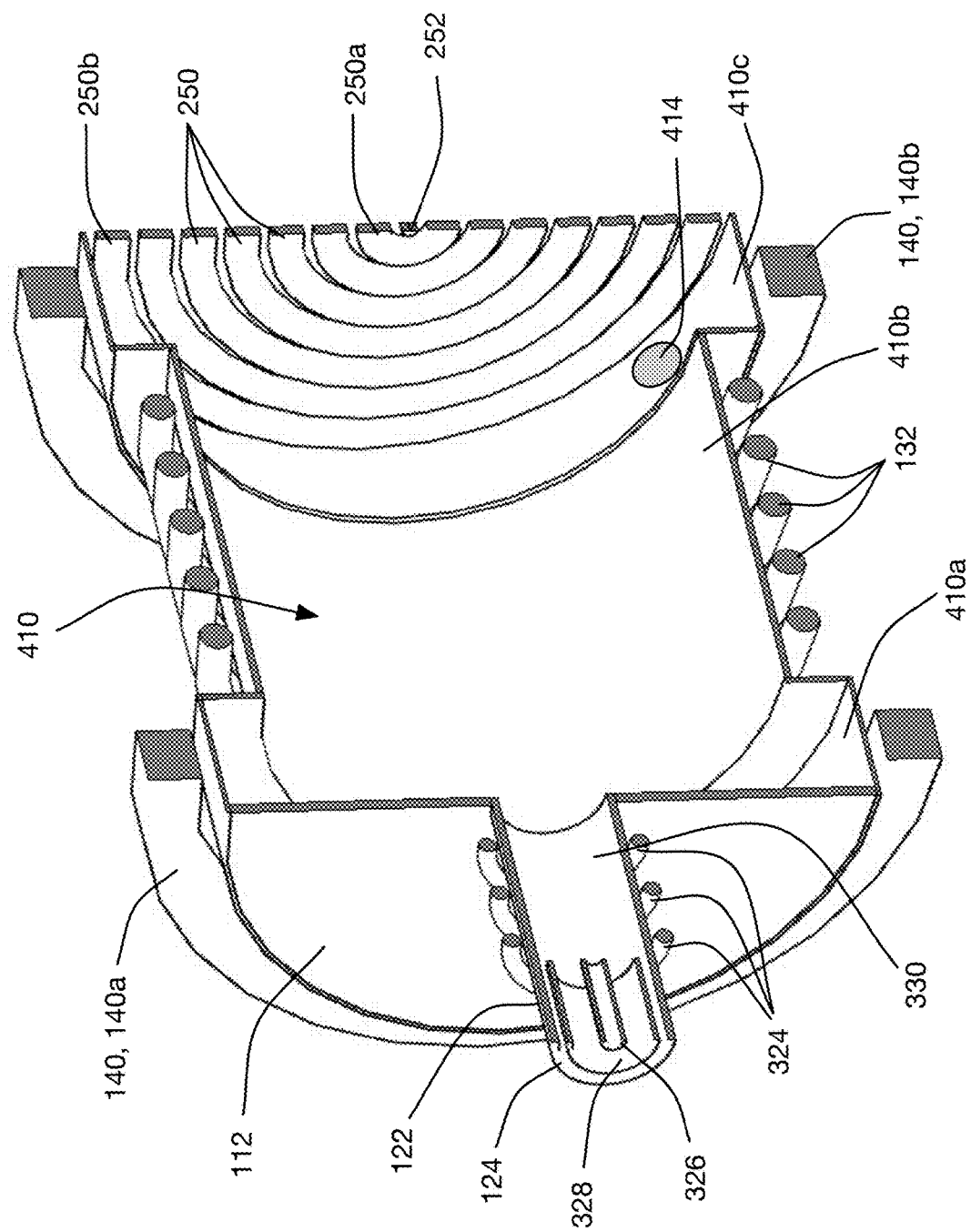
FIG. 4A shows an isometric section-view of the separation apparatus of FIG. 1.
Figure 4B:
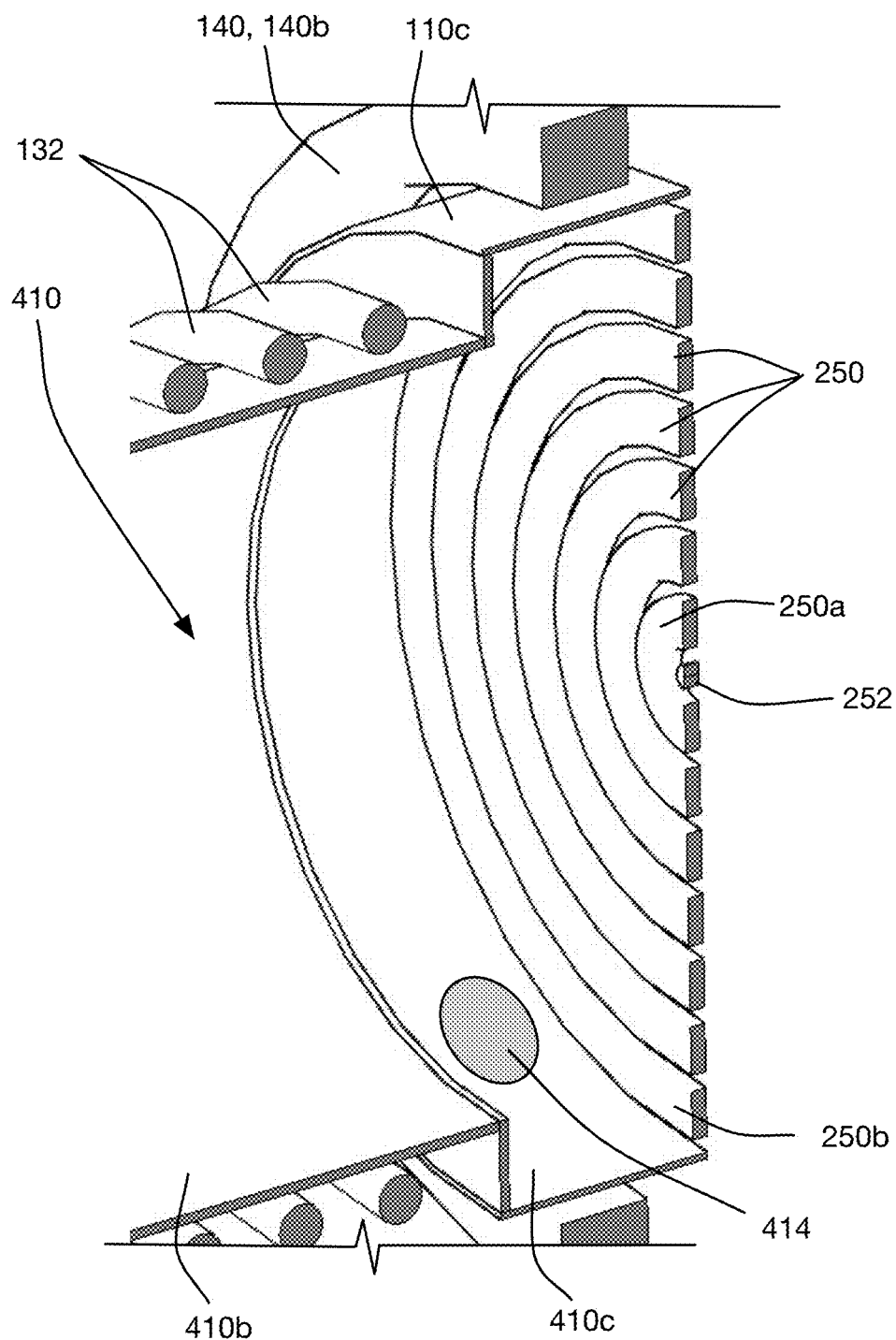
FIG. 4B shows an isometric section-view of the concentric ring electrodes on the separation apparatus of FIG. 1.

In the specific embodiment provided in FIGS. 1, 2 and 4A, at least one of the inlet end 111 and outlet end 113 of the apparatus housing 110 includes a circular, end wall (inlet end wall 112 is shown in FIG. 1), where the circular end wall defines an inlet and/or outlet end face of the apparatus housing 110. The inlet and/or outlet end walls include the above-described through-openings 116, 214 in fluid communication with the cylindrical separation chamber 410.

As described previously, the apparatus housing 110 includes sequential first, second and third axial housing sections (110a, 110b, 110c) which each surround a portion of the cylindrical separation chamber 410. In the specific embodiment provided in FIG. 1, 2, 4A and 4B, the first, second and third axial housing sections (110a, 110b, 110c) are each defined as ring-shaped, axial housing sections that circumferentially surround a portion of the cylindrical separation chamber 410. As shown in FIG. 4A, each of the first, second and third axial housing sections include an internal annular surface, defined as first, second and third internal surfaces 410a, 410b, 410c.

As described previously, the apparatus housing 110 also includes at least one first outlet aperture 414 through which the high-mass portion of the supply of HLW is collected. In an embodiment such as in FIGS. 4A, the at least one first outlet aperture is formed on at least one of the first, second and third internal surfaces 410a, 410b, 410c. In the specific embodiment provided in FIGS. 4A and 4B, the internal surface of at least one of the first, second and third axial housing sections (110a, 110b, 101c) that includes the at least one outlet aperture 414 is the third internal surface 410c. The at least first one outlet aperture 414 is two circular outlet apertures which are defined on opposing lower portions of the third internal surface 410c of the apparatus housing 110 (only one aperture is shown within the section view of FIG. 4A). In this embodiment, the two circular outlet apertures are provided on a lower portion of the apparatus housing 110 such that gravity will draw the high-mass portion of the supply of HLW downwards, towards the outlet apertures 414.

In an embodiment of the apparatus housing 110, a length of the cylindrical separation chamber 410 is less than 4 metres, and the narrowest diameter along the length of the cylindrical separation chamber 410 is between 0.2 to 2 metres. In the specific embodiment provided in FIG. 7, the length of the cylindrical separation chamber 410 is 0.35 metres, and the diameter of the separation chamber 410 is 0.28 metres.

In an embodiment, the first and third axial housing sections (110a, 110c) are composed of an electrically conductive material, and the second axial housing section 110b is at least partially composed of an electrically insulating material.

In an additional embodiment, the electrically conductive material of the first and third axial housing sections (110a, 110c) is a material such as graphite or steel that is for use in a highly conductive electrode In an additional embodiment, the electrically insulating material of the second axial housing section 110b is a dielectric material such as quartz.

In an embodiment, the apparatus housing 110 is a modular apparatus housing. In this embodiment, the first, second and third axial housing sections (110a, 110b, 110c) are each formed as a removably mountable housing section, where each of the removably mountable housing sections can be separated or can be mounted together to form the apparatus housing 110.

Figure 5:
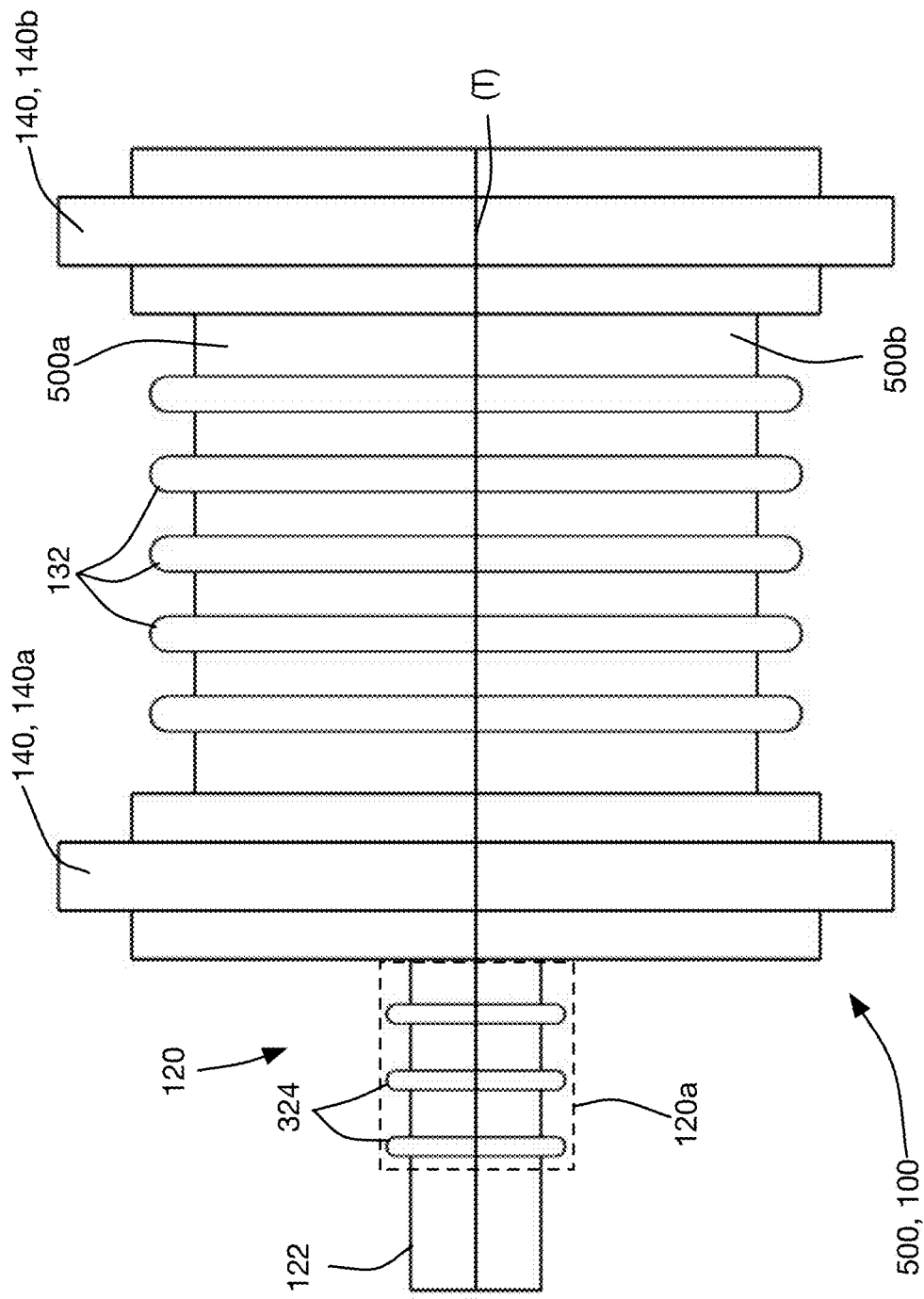
FIG. 5 shows a side view of an embodiment of the separation apparatus where the apparatus housing is a modular apparatus housing that can separate along a long axis of the separation apparatus.
Figure 6:
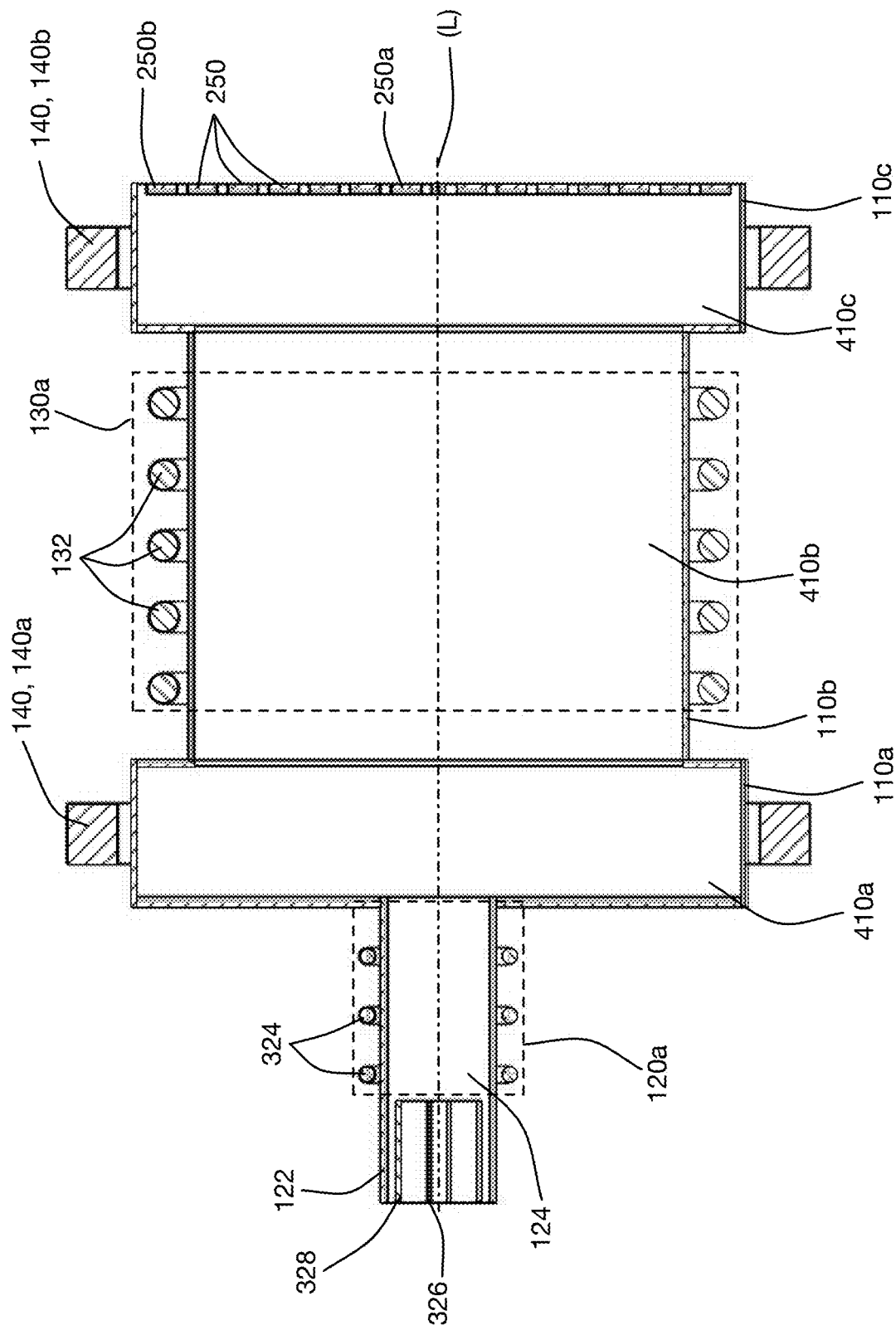
FIG. 6 shows a side, section view of the separation apparatus of FIG. 1.

In an alternate embodiment shown in FIG. 5, the apparatus housing 100 is a modular apparatus housing 500 that includes two semicylindrical housing sections 500a, 500b. Each semicylindrical housing section includes half of the each of the first, second and third axial housing sections. As shown in FIG. 5, the semicylindrical housing sections are removably mounted together along the joining line (T) to form the cylindrical apparatus housing.

In an alternate embodiment, the separation apparatus 100 is configured such that the apparatus housing 110 includes a substantially continuous cylindrical shell that is composed of an electrically conducting material and that defines the cylindrical separation chamber 410 therewithin. In this embodiment, the first and third axial housing sections (110a, 110c) are defined as opposing end sections of substantially continuous cylindrical shell. In this embodiment, a tubular sleeve of dielectric material with a length that is less than a length of the cylindrical separation chamber 410 is provided within the cylindrical separation chamber 410. The tubular sleeve is centrally disposed along the length of the separation chamber 410 and in this way, the tubular sleeve defines the second axial housing section 110b and the internal surface of the second axial housing section 410b.

In an embodiment of the separation apparatus 100 as disclosed herein, a multi-part input stream is provided to an open, inlet end of the injection channel 124 of the first ICP torch 120. The multi-part input stream includes a supply of liquid HLW, and a supply of a plasma-forming gas.

In an embodiment, the supply of a plasma-forming gas is a supply of at least one noble has such as argon or helium.

In an embodiment, at least part of the supply of plasma-forming gas is provided through the injection channel 124 of the first ICP torch 120 before the injection of the supply of HLW. In this way, at least part of the supply of plasma-forming gas is ionized by the first ICP torch 120 and forms the plasma discharge prior to any injection of the supply of HLW.

In an embodiment, the supply of liquid HLW is liquid nuclear waste formed from sources of liquid and solid nuclear waste, where the liquid and solid nuclear waste sources are combined to form the supply of liquid HLW.

In an embodiment, the supply of HLW includes a solid waste portion from spent fuel (SP) assemblies and a liquid waste portion from spent fuel reprocessing.

In an embodiment where the supply of HLW includes a solid portion and a liquid portion, the supply of HLW that is provided to the inlet of the injection channel 124 in the first ICP torch 120 of the separation apparatus 100 is a pre-processed supply of HLW that has undergone at least one waste preprocessing stage. The at least one waste preprocessing stage may include a PUREX and/or a UREX processing step. In this PU REX and/or a UREX processing step, the solid waste portion of the HLNW is liquified by dissolving the solid wase portion in $HNO_3$ to form $UO_2(NO_3)_2$ (aq), $Pu(NO_3)_4$ (aq) and nitrates of other metals. This aqueous solution can be combined with the liquid waste portion and is suitable for injection into the inlet end of the injection channel 124 of the first ICP torch 120 as part of the liquid supply of HLW.

As described previously, the multi-species stream including the partially ionized supply of the HLW, at least part of the supply of plasma-forming gas and the plasma discharge, is injected into the separation chamber 410 from the injection channel 124 of the first ICP torch 120. The multi-species stream is formed through ionization of the multi-part input stream within first ICP torch 120.

The functioning of the first ICP torch 120 in forming the multi-species stream from the multi-part input stream will now be described.

In an embodiment, the liquid supply of the HLW and supply of plasma forming has are provided together as part of the multi-part input stream to the inlet end of injection channel 124 of the first ICP torch 120. The first ICP torch 120 is provided at the inlet end 111 of the housing 110 to function as a nebulizer, a gas injector and a plasma torch. In the formation of the multi-species stream from the multi-part inlet stream, the supply of liquid HLW is inserted through an inner injection tube 326 of the first ICP torch 120 to form a nebulized gas of the HLW. The first ICP torch 120 is formed to at least partially ionize the supply of plasma forming gas to form the plasma discharge. As noted above, the plasma forming gas can be supplied as an input stream to the first ICP torch 120 prior to the introduction of the liquid supply of HLW such that the plasma-forming gas will generate the plasma discharge before the supply of HLW is introduced into the injection channel 124. The high temperature of the plasma discharge will then partially ionize the nebulized gas of the HLW. In this way, the first ICP torch 120 will generate the multi-species stream including the partially ionized supply of the nebulized gas of the HLW and a plasma discharge formed from at least part of the plasma-forming gas. The injection channel of the first ICP torch 120 also includes an outlet end for injecting this multi-species stream into the separation chamber 410 via the through-opening 116.

Figure 3:
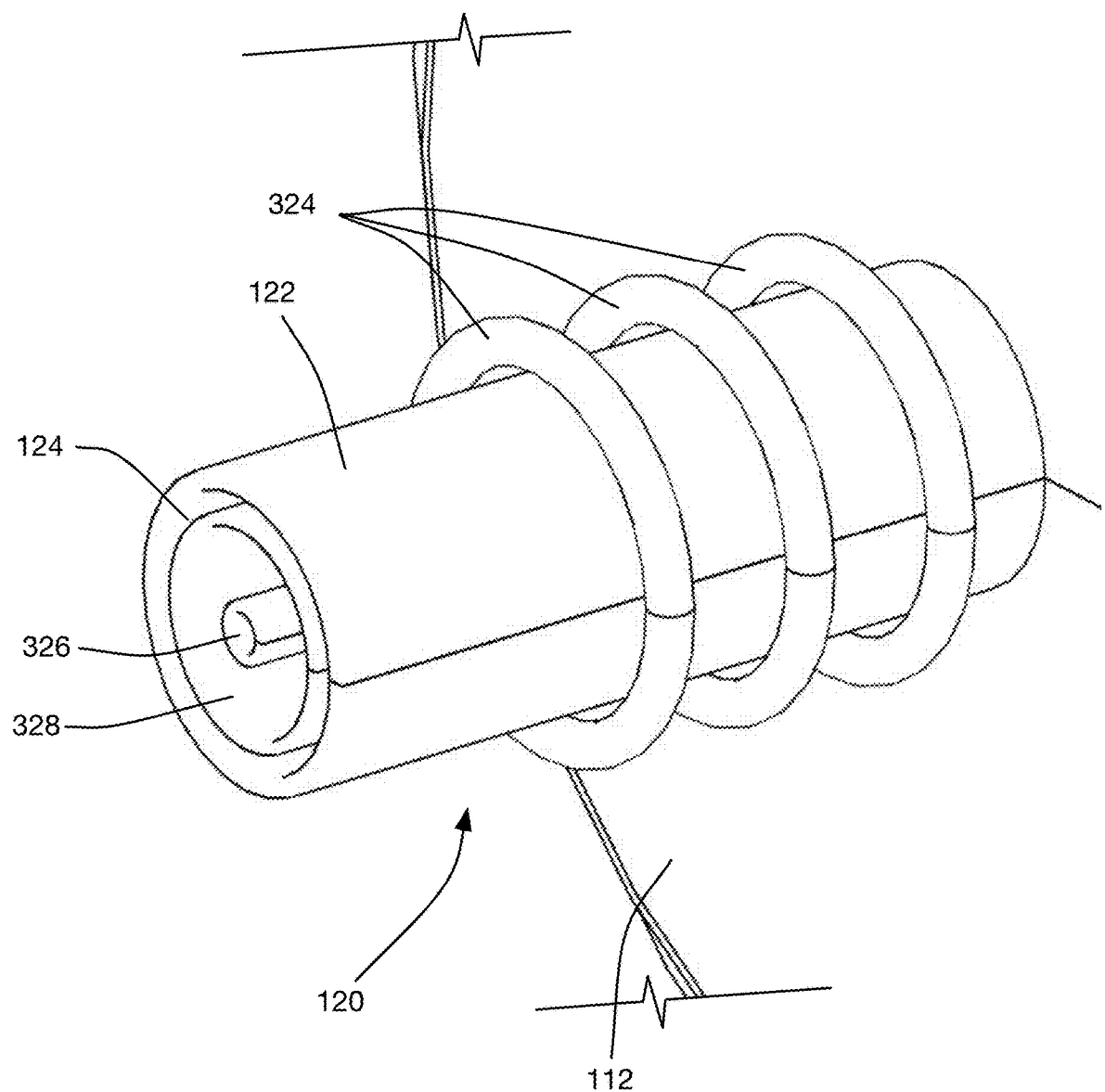
FIG. 3 shows a close-up, isometric view of a first ICP (Inductively-coupled Plasma) torch of the separation apparatus in FIG. 1.

Referring to FIGS. 1 and 3, an embodiment of the structure of the first ICP torch 120 is provided. In this embodiment, the first ICP torch 120 is mounted to the inlet end 111 of the apparatus housing 110. The first ICP torch 120 is formed to receive the multi-part input stream through an inlet end of the injection channel 124, and the first ICP torch 120 is mounted to the inlet end 111 of the housing such that the injection channel 124 is in fluid communication with the through-opening 116 of the inlet end 111. In the specific embodiments provided in FIGS. 1, 3, 4A, 4B, 5, 6 and 7, the first ICP torch 120 is mounted to the inlet end wall 112 such that the first ICP torch 120 is substantially concentric with at least one of the cylindrical apparatus housing 110 and the cylindrical separation chamber 410.

In an embodiment such as shown in FIGS. 1, 2 and 3, the first ICP 120 torch includes a torch body 122, the injection channel 124 extending between opposing ends of the torch body 122 of the first ICP torch 120. The first ICP torch 120 also includes a first rf coil 324 that circumferentially surrounds a length of the torch body 122 and the injection channel. In the specific embodiment provided in FIG. 3, the first rf coil 324 of the first ICP torch 120 is circumferentially disposed along a length of an outer surface of the torch body 122.

In an embodiment, the torch body 122 is a tubular torch body 122, and an end face of the tubular torch body 122 is mounted to the inlet end wall 112 of the apparatus housing. In an additional embodiment where the torch body 122 is a tubular torch body 122, the first rf coil 324 is positioned to be substantially concentric with the tubular torch body 122.

In an embodiment, the tubular torch body 122 is at least partially composed of quartz, and the first rf coil 324 of the first ICP torch 120 is at least partially composed of copper.

A length of the injection channel 124 that is circumferentially surrounded by the first rf coil 324 defines a torch region 120a of the first ICP torch 120, where the at least partial ionization of the plasma forming gas and the partial ionization of the nebulized supply of HLW occurs. In an embodiment, a portion of the torch body 122 that is defined within the torch region 120a of the first ICP torch 120 is formed of a dielectric material.

In an embodiment, the first rf coil 324 of the first ICP torch 120 is connected to at least one external voltage source that is an external rf voltage source, where the external rf voltage source is for energizing the rf coil 324 to ionize the plasma-forming gas within the injection channel 124 to form a plasma discharge within the first ICP torch 124.

In an embodiment, the coil excitation power applied to the first rf coil 324 of the first ICP torch 120 is in a range from 100 to 1000 kW, and the voltage applied across the first rf coil 324 has a magnitude of at least 1000V.

In an exemplary embodiment of the first ICP torch 120, the plasma-forming gas is pure argon, and the external voltage source is controlled to apply an 11 kW coil excitation power with a 13.56 MHz excitation frequency to the first rf coil 324. In this embodiment, the plasma discharge within the ICP torch housing will realize a temperature of at least 10000K within the torch body 122 of the first ICP torch 120.

In an additional exemplary embodiment of the first ICP torch 120, the plasma-forming gas is pure helium, and the external voltage source is controlled to apply an 11 kW coil excitation power with a 13.56 MHz excitation frequency to the first rf coil 324. In this embodiment, the plasma discharge within the ICP torch housing will realize a temperature of at least 4000K within the torch body 122 of the first ICP torch 120.

In an embodiment, an igniter element is provided within the injection channel of the first ICP torch 120 for igniting the supply of plasma forming gas in the input stream. The igniter element can then be removed once the plasma discharge is generated within the first ICP torch 120. In this embodiment, the supply of plasma-forming is provided to the inlet end of the first ICP torch 120 prior to the introduction of any of the supply of liquid waste. The first rf coil 324 of the first ICP torch 120 is power by the external power supply, and the igniter element is positioned within the injection to ignite the supply of plasma-forming gas, and to consequently generate the plasma discharge within the first ICP torch 120. In an additional embodiment, the igniter element is a graphite rod.

As presented above, the first ICP torch 120 receives and nebulizes the supply of liquid HLW.

In the specific embodiment provided in FIG. 3, the torch body 122 of the first ICP torch 120 is a tubular torch body 122, and the inlet end of the injection channel 124 in the first ICP torch 120 is an open end of the tubular torch body 122. The first ICP torch 120 also includes a pair of concentrically disposed injection elements (326, 328) mounted within the inlet end of the injection channel 124 in the tubular torch body 122.

The pair of concentrically disposed injection elements (326, 328) includes an outer injection tube 328 that extends from the inlet end, along a length of the injection channel 124. The pair of injection elements (326, 328) also includes a narrow inner injection tube 326 which extends from the inlet end, along a length of the injection channel 124. In an embodiment, the inner injection tube 326 is shorter in length then the outer injection tube 328. The outer injection tube 328 defines a first opening between the torch body 122 and the outer injection tube 328, and a second opening between the outer injection tube 328 and the inner injection tube 326.

In an additional embodiment, the first and second openings defined between the tubular torch body 122, inner injection tube 326 and outer injection tube 328 are formed to receive the supply of plasma-forming gas of the multi-part inlet stream, and the inner injection tube is formed to receive the liquid supply of HLW of the multi-part inlet stream. The inner injection tube 326 is structured as a narrow nebulizing element for nebulizing the liquid supply of HLW to produce a nebulized supply of the HLW within the injection channel 124.

By forming the nebulized supply of HLW within the inner injection tube 326, the nebulized supply of HLW will be injected into the plasma discharge of the first ICP torch 120 at a position that is aligned with or substantially close to a radial center of injection channel 124. The portions of the plasma discharge that are substantially along the radial center of the injection channel 124 will have the highest temperature plasma within the plasma discharge. By exposing the nebulized supply of HL nuclear waste to this highest temperature plasma within the plasma discharge, the first ICP torch 120 will realize a rapid, partial ionization of the nebulized supply of HLW to form the partially ionized supply of nuclear waste within the multi-species stream. The process of ionizing the HLW drives the decomposition of the chemical components of the HLW in the into ionized elemental components of the HLW.

In an embodiment, the tubular torch body 122, inner injection tube 326 and outer injection tube 328 have respective thicknesses of at least 2 mm, 2.2 mm, and 3.5 mm, as well as respective inner radii of at least 3.7 mm, 18.8 mm, and 25 mm. In this embodiment, the length of the tubular torch body 122 is at least 150 mm.

In an embodiment, each of the tubular torch body 122, inner injection tube 326 and outer injection tube 328 are composed of quartz.

In an embodiment, the nebulized supply of HLW that is generated within the first ICP torch (and within the separation chamber as the non-ionized portion of waste) is chemically inert to the plasma.

Referring to FIGS. 1, 2 and 4A, the second ICP torch of the separation apparatus 100 is shown as part of the apparatus housing 110. The second ICP torch 130 includes the second rf coil 132 which is circumferentially disposed around at least a length of the second axial housing section 110b such that the loops of the second rf coil 132 surround the length of the second axial housing section 110b. The length of the second axial housing section 110b which is surrounded by the second rf coil forms the torch body 122 of the second ICP torch 130, where the portion of the separation chamber 410 defined within the second axial housing section 110b acts as a through-channel for providing the supply of plasma-forming has within the second ICP torch 130.

The second ICP torch 130 is positioned within the separation apparatus 100 for further ionizing the at least partially-ionized supply of HLW into individual, ionized particles, where the second ICP torch 130 achieves this further ionization due to the high temperatures of the plasma generated by the second ICP torch 130 within the separation chamber 410. As presented above, the second ICP torch 130 is connected to the external voltage source for generating an rf field within the separation chamber 410, and for driving an ignition and firing of the second ICP torch. In an embodiment, the second rf coil 132 of the second ICP torch 130 is connected to at least one external power source that is an external rf power source.

In an embodiment, the first rf coil 324 of the first ICP torch 120 and the rf coil 132 of the second ICP torch 130 are connected to the same external voltage source.

In the embodiments of the separation apparatus 100 as described herein, the separation apparatus 100 includes the first and second ICP torches (120, 130) which are formed at different positions along the length of the separation apparatus 100. The provision of both the first ICP torch 120 and second ICP torch 130 ensures that a substantially complete ionization and atomization of the supply of HLW will occur. If the separation apparatus 100 was configured to only include only one ICP torch (for ionizing the waste), the rate of ionization of the supply of HLW by the ICP torch would be constant. Due to this constant rate of ionization within the apparatus, there would be a high probability that not all the HLW would be fully ionized and atomized.

Within the present embodiments of the separation apparatus 100, the precision and accuracy of the separation of the supply of HLW is proportional to the degree of ionization and atomization of the supply of HLW. That is, the more complete the ionization and atomization of the supply of waste in the apparatus, the more precisely the separation apparatus 100 will separate the supply of HLW. By providing the first and second ICP torches 120, 130 (as specified in the above-described embodiment of the separation apparatus 100), the first ICP torch 120 will partially ionize the multi-species stream that is provided through the injection channel 124 of the torch body 122 of the first ICP torch 120. As the multi-species stream that includes the partially ionized waste travels from the first ICP torch 120, into and along the separation chamber 410, remaining HLW that was not ionized and atomized by the first ICP torch 120 will pass through the plasma discharge generated in the second axial housing section 110b by the second ICP torch 130. The plasma discharge of the second ICP torch 130 will ionize and atomize the non-ionized portion of waste that is contained within the multi-species stream as the multi-species stream flows through the chamber 410, resulting in a substantially complete ionization of the supply of HLW within the separation apparatus 100.

In the specific embodiment provided in FIGS. 1, 2 and 4A, the apparatus housing 110 is the cylindrical apparatus housing 110, and the length of the second axial housing section 110b that is circumferentially surrounded by the first rf coil defines a torch region 130a of the second ICP torch 130. The torch region 130a of the second ICP torch 130 is where the further ionization of the partially ionized supply of HLW occurs. As shown in FIGS. 1 and 2, the first rf coil 132 of the second ICP torch 130 is a helical rf coil. In this embodiment, the first rf coil 132 of the second ICP torch 130 is mounted relative to the housing 110 such that the first coil 132 is substantially concentric with the cylindrical separation chamber 410.

In an embodiment, the first rf coil 132 of the second ICP torch 130 is formed of copper or a copper-based alloy.

In an embodiment such as show in FIGS. 1 and 4A, the cylindrical separation chamber 410 includes the sequentially disposed first, second and third axial housing section 110a, 110b, 110c, where an inner diameter of the second axial housing section 110b is less than an inner diameter of each of the first 110a and third axial housing sections 110c.

In this embodiment, the second (middle) axial housing section 110b has a diameter that is smaller than a diameter of each of the first and third axial housings sections 110a, 110c. By sizing the second axial housing section 110b with a relatively smaller diameter, the rf coil 132 of the second ICP torch 130 which surrounds the second axial housing section 110b is provided in closer proximity to the radial center of the separation chamber 410 (relative to the position of the magnetic elements). It is particularly beneficial to have the rf coils 132 of the second ICP torch 130 be disposed close to the radial center of the separation chamber 410. By providing the rf coils 132 of the second ICP torch 130 closer to the middle of the chamber 410, the rf coils 132 are also more proximate to the supply of the plasma-forming gas, which in turn drives a more stable production of plasma by the second ICP torch 130 within the separation chamber 410.

In an embodiment of the second ICP torch 130 of the separation apparatus 100, the first rf coil 132 of the second ICP torch 130 has a diameter of at least 10 mm and has at least three complete turns.

In an exemplary embodiment of the second ICP torch 130, the plasma-forming gas is argon, and the external voltage source is controlled to apply an 11 kW coil excitation power with a 13.56 MHz excitation frequency to the first rf coil 324. In this embodiment, the plasma discharge within the second ICP torch 130 will realize a temperature of at least 7000K within the separation chamber 410.

In an exemplary embodiment of the second ICP torch 130, the plasma-forming gas is helium, and the external voltage source is controlled to apply an 11 kW coil excitation power with a 13.56 MHz excitation frequency to the first rf coil. In this embodiment, the plasma discharge within the second ICP torch 130 will realize a temperature of at least 2500K within the separation chamber 410.

In an additional embodiment of the igniter element described above, the igniter element is provided within the injection channel 124 of the first ICP torch 120 and within the separation chamber 410 of the apparatus housing 110 such that a portion of the igniter element extends into the portion of the separation chamber 410 surrounded by the second axial housing section 110b. In this embodiment, the igniter element is provided within the separation apparatus 100 for igniting the supply of plasma forming gas in the injection channel 124 of the first ICP torch 120, and within the torch portion 130a of the second ICP torch 130 defined within the separation chamber 410. In this embodiment, the supply of plasma-forming is provided to the inlet end of the first ICP torch 120 prior to the introduction of any of the supply of liquid HLW. The first rf coil 324 of the first ICP torch 120 and first rf coil of the second ICP torch are then powered by the at least one external voltage source, and the igniter element is positioned within the injection channel 124 and separation chamber 410 to ignite the supply of plasma-forming gas, and to consequently generate the plasma discharge within the first and second ICP torches 120, 130. The igniter element can then be removed once the plasma discharge is generated within the first ICP torch 120 and the second ICP torch.

Figure 7:
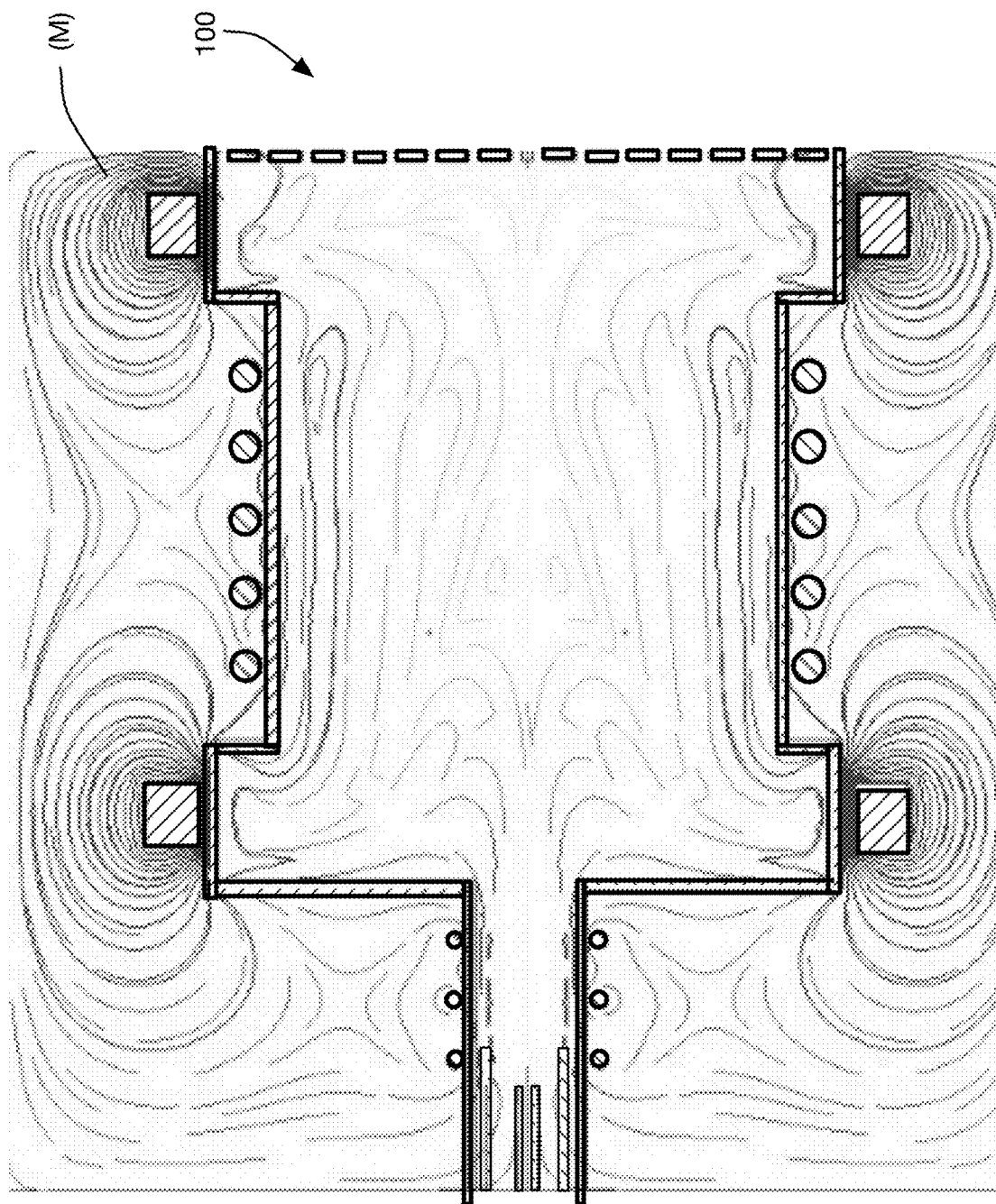
FIG. 7 shows the side, section view of the separation apparatus in FIG. 6 with a diagram of the magnetic field produced by the first and second magnetic elements.

Referring to FIGS. 1, 2, 6 and 7, the separation apparatus 100 includes the first and second magnetic elements that are circumferentially disposed around the first axial housing section and the third axial housing section. As shown in FIG. 7, the first and second magnetic elements produce a magnetic field (M) that is substantially parallel to the longitudinal axis (L) of the cylindrical separation chamber 410. In the exemplary embodiment provided in FIG. 7, the generated magnetic field extends throughout the separation chamber 410.

In the specific embodiments provided in FIGS. 1, 2, 6 and 7, the first and second magnetic elements 140a, 140b are first and second ring-shaped magnetic elements which are positioned to fully extend around the circumference of the first and third axial housing sections 110a, 110c. The first and second magnetic elements 140a, 140b are axially spaced apart along longitudinal axis (L) of the cylindrical separation chamber 410 such that the first and second magnetic elements 140a, 140b are positioned on opposing sides of the second axial housing section 110b.

In this embodiment, the first and second magnetic elements 140a, 140b are spaced apart on opposing sides of the rf coil 132 of the second ICP torch 130 and around the first and third axial housing sections 110a, 110c to impart a strong helicon effect to the charged particles of the multi-species stream within the separation chamber 410. By positioning first and second elements 140a, 140b at opposing sections of the separation chamber 410, the balance of the magnetic field is defined at the center of the separation chamber 410. As the balance of the magnetic field defines the mass cutoff point for starting the mass separation process of the multi-species stream in the separation chamber 410, defining the balance of the magnetic field at the center of the separation chamber 410 will drive the mass separation to start at the center of the separation chamber 410 (e.g., at the center of the portion of the separation chamber 410 that is surrounded by the second axial housing section 110b). In embodiments described herein, the center of the separation chamber is within the second axial housing section 110, a length of which defines the torch region 130a of the second ICP torch 130. By driving the separation to occur within the torch region 130a of the second ICP torch 130 and at the center of the separation chamber 410, the separation apparatus 100 achieves a balanced separation of the supply of HLW. If the first and second magnetic elements 140a, 140b were not axially spaced apart along the length of the separation chamber 410, the balance of the magnetic field would shift away from the center of the separation chamber 410, towards the longitudinal position of the first and second magnetic elements 140a, 140b.

In an embodiment, the first and second magnetic elements 140a, 140b are first and second electromagnets. The first and second electromagnets are connected to at least one external power source for generating the magnetic field between the first and second electromagnets, which is substantially parallel to a longitudinal axis of the cylindrical separation chamber 410.

In an alternate embodiment, the first and second magnetic elements 140a, 140b are first and second permanent magnets. The first and second permanent magnets are disposed about the first and third axial housing sections for producing the magnetic field which is substantially parallel to a longitudinal axis of the cylindrical separation chamber 410.

Referring to FIGS. 2, 4A, 4B and 6, the separation apparatus 100 includes the plurality of concentric ring electrodes 250 that are mounted within the through aperture of the outlet end 113 of the apparatus housing 110. The plurality of concentric electrodes 250 include at least an innermost electrode 250a and an outermost electrode 250b. The electric field within the separation chamber 410 of the separation apparatus 100 is generated through the application of voltage difference between at least the innermost concentric electrode 250a and the outermost electrode 250b.

In an embodiment, each of the concentric ring electrodes 250 is composed of an electrically conductive materials such as steel or graphite.

In an embodiment of the plurality of concentric electrodes 250 provided in FIG. 4A, the innermost concentric electrode 250a defines a second outlet aperture therethrough 252. In an alternate embodiment, the innermost concentric electrode includes a receiving nozzle mounted therethrough, where the receiving nozzle defines the second outlet aperture 252.

The second outlet aperture 242 is formed to receive the low-mass portion of the nebulized supply of HLW that is provided into the separation chamber 410.

The plurality of concentric electrodes 250 are connected to at least one external power source such that each of the plurality of concentric electrodes 250 receives a unique electric potential from the at least one external power source for generating an electric field that is oriented perpendicular to the magnetic field.

In an embodiment, the electric potential (e.g., the voltage) applied to each of the concentric electrodes 250 by the at least one external power source is configured such that the voltage applied to each of the concentric electrodes 250 is proportional to the diameter of each of the concentric electrodes 250. Said another way, the voltage applied to a more radially outward one of the concentric electrodes 250 will be greater than the voltage applied to a more radially inward one of the concentric electrodes 250.

The electric field generated from the plurality of concentric electrodes 250 is also oriented to extend along the lengthwise direction of the separation chamber 410 such that the magnetic field and electric field produced by the respective first and second magnetic elements and the concentric ring electrodes 250 are perpendicular along the lengthwise direction of the separation chamber 410. The magnetic and electric fields form a crossed electromagnetic field within the separation chamber 410.

The plurality of concentric electrodes 250 are connected to at least one external power source such that each of the plurality of concentric electrodes 250 receives a unique electric potential from the at least one external power source for generating an electric field that is oriented perpendicular to the magnetic field.

In an embodiment, the electric potential (e.g., the voltage) applied to each of the concentric electrodes 250 by the at least one external power source is configured such that the voltage applied to each concentric electrode 250 is proportional to the diameter of each of the concentric electrodes 250. Said another way, the voltage applied to a more radially outward one of the concentric electrodes 250 will be greater than the voltage applied to a more radially inward one of the concentric electrodes 250.

The electric field generated from the plurality of concentric electrodes 250 is also oriented to extend along the lengthwise direction of the separation chamber 410 such that the magnetic field and electric field produced by the respective first and second magnetic elements and the concentric ring electrodes 250 are perpendicular along the lengthwise direction of the separation chamber 410. The magnetic and electric fields form a crossed electromagnetic field within the separation chamber 410.

In an embodiment where the first and second magnetic elements 140a, 140b are first and second electromagnets, the external power source is controlled to apply a current of at least 2 kA through each of the first and second magnetic elements 140a, 140b such that the magnetic elements 140a, 140b generate a 300 G (0.03 T) magnetic field.

By providing the crossed magnetic and electric fields that are perpendicular along the lengthwise direction of the separation chamber 410, a centrifugal separation of the high-mass and low-mass portions of HLW in the multi-species stream is achieved. The plasma discharge and ionized waste formed by the first and second ICP torches 120, 130 will interact with the crossed magnetic and electric fields. The charged particles within the multi-species stream will be driven by the crossed magnetic and electric fields to move in helical patterns within the separation chamber 410, and the crossed magnetic and electric fields will drive the separation of the charged particles of the multi-species stream (i.e., the ions of plasma and HL waste) within the separation chamber 410.

In an embodiment where the magnetic field applied parallel to the longitudinal axis of the separation chamber 410 is a constant magnetic field, and the concentric ring electrodes 250 generate an electric field with a radial voltage profile that is proportional to the radius of the separation chamber 410, the motion of a single particle (of the multi-species stream) having mass m and charge $Z_e$, within the chamber 410 can be approximated using the following equation.

$$m\frac{d^2\bar{x}}{dt^2} = Ze\left(E_r\hat{r} + \frac{d\bar{x}}{dt} \times (B\hat{z})\right)$$

Where $\bar{x}$, is the position of the particle, $E_r$ is the electric field radial voltage profile and B is the magnetic field profile.

During this helical motion, the particles of the multi-species stream with higher atomic mass will experience more centrifugal force than lower-mass particles of the multi-species stream. Due to this difference in the centrifugal forces, when the multi-species stream is injected into the separation chamber 410, the high-mass portion of the supply of HLW will be ejected radially outwards towards the internal surfaces 410b, 410c of the apparatus housing 110, while the low-mass portion of the supply HLW will be driven substantially along the longitudinal axis of the separation chamber 410, towards the second outlet aperture 252. In this way, the high-mass portion of the ionized supply of HLW can be collected at the at least one first outlet aperture 414, and the low-mass portion of the ionized supply of HLW can be collected at the second outlet aperture 252.

In an embodiment, the concentric ring electrodes 250 are formed such that the innermost concentric electrode 250a has as an outer diameter of at least 7 mm, and each supplementary concentric electrode 250 has a diameter that is at least 5 mm greater than the diameter of an immediately interior concentric electrode 250.

In an embodiment, each of the concentric ring electrodes 250 are connected to a separate external power supply unit. Each of the separate external power supplies are controlled to provide a constant voltage to a corresponding electrode of the plurality of concentric electrodes 250. In an alternate embodiment, each of the concentric ring electrodes 250 are connected to a single external power supply unit via a plurality of connecting elements, where the single external power supply unit is controlled to provide a unique, constant voltage to each of the plurality of concentric electrodes 250 through the plurality of connecting elements.

In an embodiment, the power provided to the plurality of concentric electrodes 250 by the at least one external power supply unit has both an AC voltage component and a DC voltage component.

In an embodiment, the third axial housing section 100c is composed of an electrically conductive material and is provided as a zero potential region (e.g., as a ground region) of the separation apparatus 100 relative to the electric field which will have a positive potential within the separation chamber 410.

In an additional embodiment where the outlet end 113 of the apparatus housing 110 includes an end wall and where the through-opening 214 of outlet end 113 of apparatus housing 110 is formed in the end wall of the outlet end 113, the concentric ring electrodes 250 are mounted within a through-opening of the end wall.

In an embodiment where the outlet end 113 of the apparatus housing 110 includes the outlet end wall, the end wall of the outlet end 113 is composed of a conductive material such that the end wall may function as the outermost electrode 250b. In this embodiment, the end wall of the outlet end 113 is also connected to the at least one external power source such that a voltage potential may be applied thereto. In this embodiment, the electric field within the separation chamber 410 of the separation apparatus 100 is generated through the application of a voltage difference between at least the innermost concentric electrode 250a and the conductive end wall of the outlet end 113.

In the specific embodiment provided in FIG. 2, the through-opening 214 of the outlet end of the cylindrical apparatus housing 110 is defined such that the through-opening 214 constitutes the entire circular end of the apparatus housing 110. In this embodiment, the concentric ring electrodes 250 are mounted within the through-opening 214 of the outlet end of the apparatus housing 110.

In an additional embodiment where the outlet end 113 of the apparatus housing 110 is an open end, the third axial housing section 110c extends to the end of the housing 110 and is composed of a conductive material. In this embodiment, the conductive third axial housing section 110c is also connected to the at least one voltage source such that the third axial housing section 110c may function as the outermost electrode 250b. The third axial housing section 110c is connected to the at least one external power source such that a voltage potential is applied thereto. In this embodiment, the electric field within the separation chamber 410 of the separation apparatus 100 is generated through the application of a voltage difference between at least the innermost concentric electrode 250a and the third axial housing section 110c.

In an embodiment, after the mass separation of the supply of HLW into its high-mass and low-mass portions, the separated high mass ions with atomic masses above the cutoff mass and the low mass ions with atomic masses below the cutoff mass are collected in the different waste collectors. The waste collectors of the high-mass and low-mass portions are connected to the at least one first outlet aperture 414 and the second outlet aperture 252, respectively.

In an embodiment, the at least one first outlet apertures 414 is provided in fluid connection with an external vacuum source or an external negative pressure source for drawing the high-mass ions through the first outlet aperture 414. Since the high-mass ions are thrown into the radial wall, the vacuum suction or negative pressure will draw the high-mass ions through the at least one first outlet aperture 414 and out of the separation chamber 410.

In an embodiment, the second outlet aperture 252 is provided in fluid connection with an external vacuum source or an external negative pressure source for drawing the low-mass ions through the first outlet aperture 414. In this way, the low mass ions that accumulate along the center of the separation chamber 410 can be collected through the second outlet aperture 252. Within the separation apparatus 100, the inlet pressure of the multi-species inlet stream will also act to push the separated low-mass ions towards the second outlet aperture 252, along the length of the separation chamber 410.

In an embodiment, the multi-part input stream provided in the inlet end of injection channel 124 in the torch body 122 of the first ICP torch 120 is provided at a substantially constant injection pressure. In this way, the low-mass portion of the nebulized supply of HLW that is formed from the multi-part input stream will be advanced along the separation chamber 410 and fed through the second outlet aperture 252 at a steady, substantially constant pressure.

In an embodiment, at least some of the plurality of concentric ring electrodes 250 are removably mounted in the through-opening of the outlet end 113 of the apparatus housing. In this way, the concentric ring electrodes 250 rings are part of a low-mass collection outlet within the separation chamber 410 during operation of the separation apparatus 100, and the plurality of concentric electrodes 250 can then be removed in order to access the interior of the separation chamber 410.

In an embodiment, a method of use for the separation apparatus 100 includes: providing at least one igniter element within the injection channel 124 of the first inductively-coupled plasma torch 120 and within the separation chamber 410, providing a supply of the plasma-forming gas to the separation apparatus 100 along the injection channel 124 of the first inductively-coupled plasma torch, energizing each of the first and second inductively-coupled plasma torches 120, 130 for ionizing the supply of the plasma-forming gas within the injection channel 124 and within the separation chamber 410, providing a liquid supply of high-level nuclear waste to the injection channel 124 of the first inductively-coupled plasma torch together with the supply of the plasma-forming gas, energizing each of the first and second magnetic elements 140a, 140b and the plurality of concentric electrodes 250 to generate the magnetic field and the electric field perpendicular to the magnetic field.

In the separation apparatus 100 as disclosed herein, the separation apparatus 100 will define a cut-off mass point. The cut-off mass point defines a mass which effectively "separates" the low-mass and high mass portions of the supply of HLW. Within the separation chamber 410, ions with atomic masses above the cut-off mass point do not stay confide within the plasma and are thrown out towards the internal walls (410a, 410b, 410c) of the apparatus housing, whereas ions with atomic masses below the cut-off mass are confined towards the longitudinal axis (L) of the separation chamber 410.

The separation chamber diameter, plasma radius, magnetic field strength, electric field strength, and gas flow rate are the parameters which dictate the mass cutoff point of the separation chamber 410.

In an embodiment, the characteristics of magnetic and electric fields are controlled to alter the cut-off mass point for given supply of waste In an embodiment where the content of the HL nuclear waste provided to the system is known, the content of the waste is utilized to determine a suitable cut-off mass point, where the cutoff mass point is determined using the following equation $$A_{Cutoff} = \frac{m_c}{Zm_H} = \frac{B^2 R_{Wall}^2 e}{8Vm_H}$$

$A_{Cutoff}$=cutoff atomic weight/mass, $m_c$=mass of the cutoff atom, $m_H$=mass of hydrogen, Z=ion charge, B=magnetic field strength, $R_{Wall}$=plasma radius, V=voltage difference of voltage applied to innermost concentric electrode and outermost electrode 250b, e=electron charge.

Based on the content of the waste, the cutoff mass point is adjusted by varying the applied magnetic and electric fields within the separation chamber 410.

In an embodiment, at least one of the magnetic or electric fields is varied by varying the frequency and power of the excitation currents provided from the external power sources connected to the first and second magnetic elements, and the plurality of concentric ring electrodes 250.

EXAMPLES

Figure 8A:
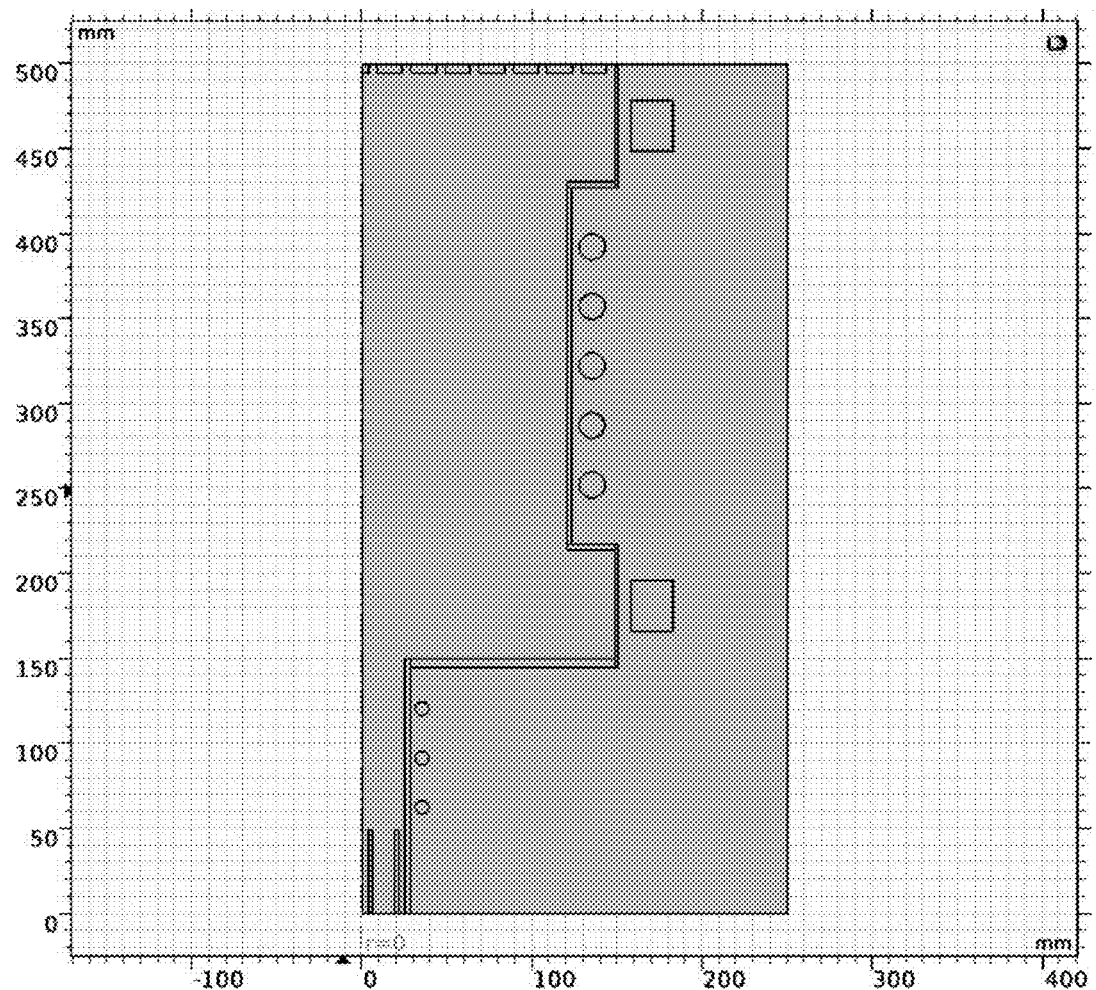
FIG. 8A shows a plot of an exemplary embodiment of the 2-dimensional separation apparatus used in the COMSOL simulations described herein.
Figure 8B:
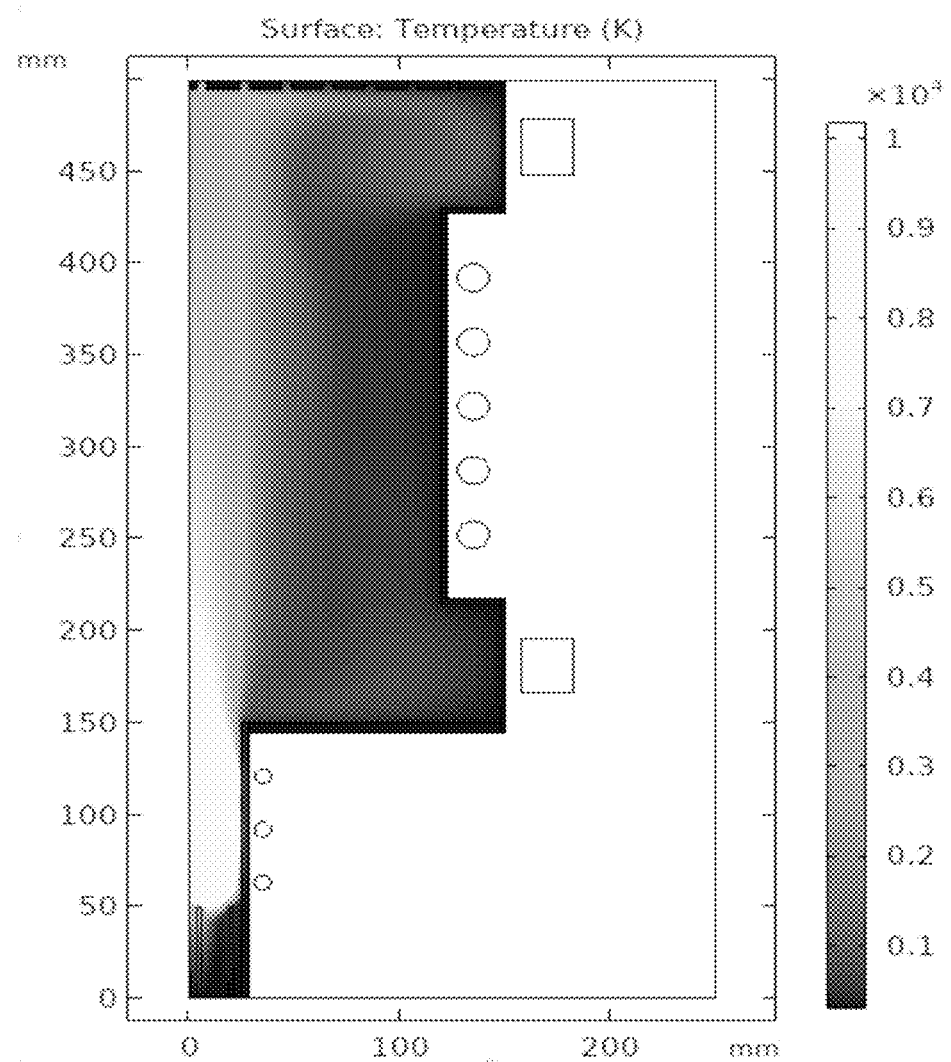
FIG. 8B shows a temperature profile plot of the first ICP torch from the exemplary COMSOL simulations described herein.
Figure 8C:
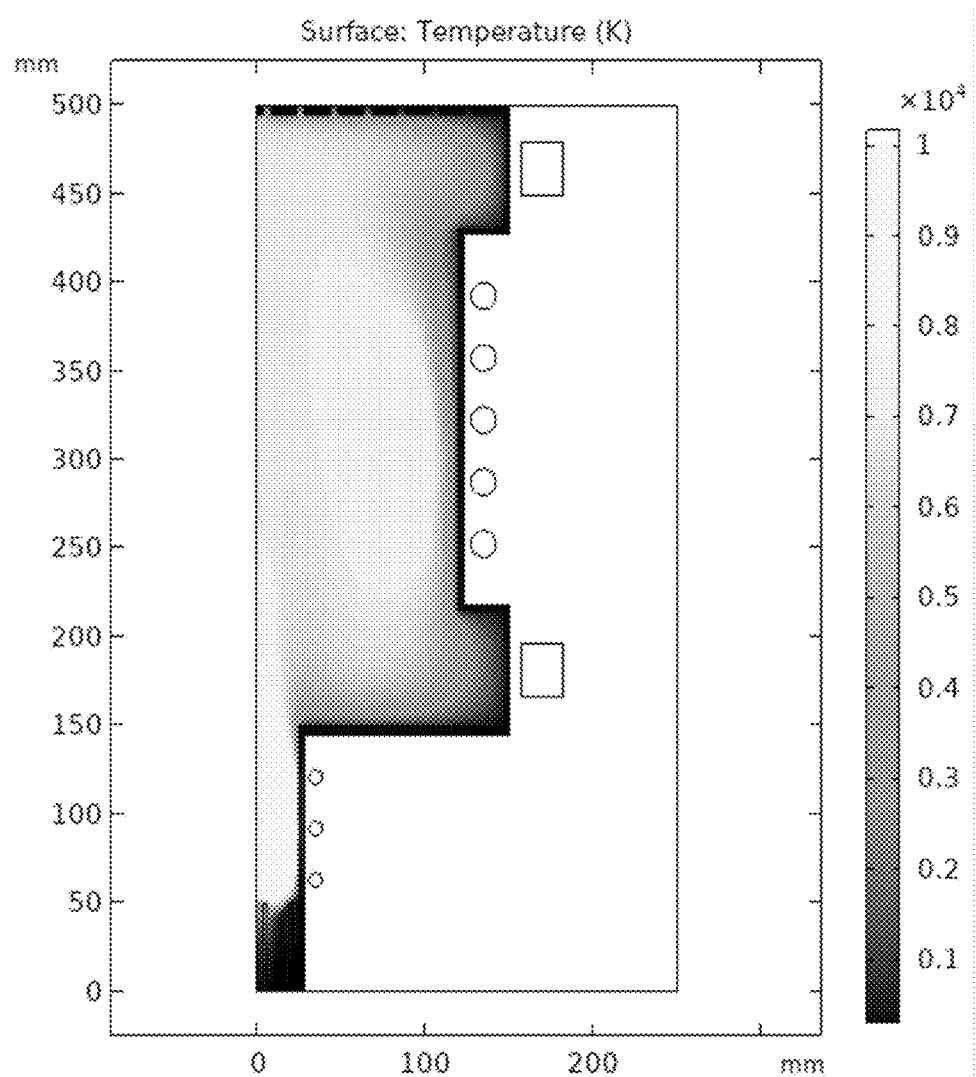
FIG. 8C shows a temperature profile plot of the first and second ICP torches from the exemplary COMSOL simulations described herein.

In the non-limiting exemplary embodiment provided in FIGS. 8A to 8C, the performance of a 3-D model of the separation apparatus 100 disclosed was simulated using the COMSOL multi-physics simulation tool. In this exemplary embodiment, a simulation of a high-level mass separation was carried out using a built-in ICP plasma module coupled with AC/DC voltage source models, particle tracking, and a built-in optimization module in the COMSOL simulation tool. Table 1 below provides the parameters in the simulated separation apparatus 100 within the COMSOL simulation tool.

TABLE 1

| Parameter | Experimental | Practical |
|---|---|---|
| $L_∥$ (chamber axial length) | 0.35 m | <4 m |
| a (chamber radius) | 0.07 m | 0.2-1 m |
| Magnet | electromagnet | permanent/electromagnet |
| $B_∥$ (magnetic field) | 0.01-0.15 T | ≥0.25 T |
| $P_{rf}$ (RF power) | 11 kW | 100-1000 kW |
| Z (ion charge) | ~1 | 1-2 |
| Voltage | ≤210 V | ≥1000 V |

Referring to FIG. 8A, a 2-dimensional, axisymmetric model of the mass separation apparatus 100 using in the COMSOL simulation is provided. For the exemplary simulation, the first ICP torch 120 was configured with three gas channels in the form of three concentric, quartz cylindrical tubes with thicknesses of 2 mm, 2.2 mm, and 3.5 mm, and an inner radius of 3.7 mm, 18.8 mm, and 25 mm, respectively. Argon gas was used as the plasma-forming gas in each simulation. Three turns were used for the RF coil with a 11 kW excitation power and 13.56 MHz excitation frequency, and 8 mm diameter. Copper was used for the coil material in the COMSOL simulation.

In this exemplary embodiment, several assumptions were included to achieve a more suitable simulation time and lower computational cost. For example, it was assumed that the thin plasma is at local thermodynamics equilibrium (LTE). Under LTE, the plasma can be considered a conductive fluid mixture which can be modelled using the magnetohydrodynamics (MHD) equations. It was also assumed that the input gases were pure argon with laminar flow at atmospheric pressures. Current displacement, viscous dissipation, and pressure work were all neglected.

Using the experimental parameters defined in Table 1, a 2-dimensional axisymmetric simulation was carried out to determine plots of the temperature profile within the separation chamber for two simulation cases: a first case where only the first ICP torch 120 is discharging plasma (See FIG. 8B), and a second case where both the first and second ICP torches are firing (See FIG. 8C). For the first simulation case, pure argon gas was utilized as the plasma-forming gas and a maximum coil excitation power of 11 kW was applied through the first ICP torch 120 to achieve a simulated temperature of 10000 K within the torch body 122 of the first ICP torch 120 at the beginning of the main separation chamber 410. For the second simulation case, pure argon gas was utilized as the plasma-forming gas and a maximum coil excitation power of 11 kW was applied through both the first ICP torch 120 and the second ICP torch 130 to achieve a simulated average temperature inside the separation chamber 410 of at least 7000 K.

The above-described embodiments are intended to be examples of the present disclosure and alterations and modifications may be effected thereto, by those of skill in the art, without departing from the scope of the disclosure that is defined solely by the claims appended hereto.

PART NUMBERS 100 separation apparatus
110 apparatus housing
110 housing
110a first axial housing section
110b second axial housing section
110c third axial housing section
111 inlet end
112 inlet end wall
113 outlet end
116 inlet through-opening
120 first ICP torch
120a torch region of first ICP torch
124 injection channel
130 second ICP torch
130a torch region of second ICP torch
132 second rf coil
140 magnetic elements
140a first magnetic element
140b second magnetic element
250 concentric ring electrodes
250a innermost ring electrode
250b outermost ring electrode
252 second outlet aperture
222 torch body
326 inner injection tube
328 outer injection tube
324 first rf coil
410 cylindrical separation chamber
410a internal surface of first axial housing section
410b internal surface of second axial housing section
410c internal surface of third axial housing section
414 first outlet apertures
500 modular apparatus housing
500a first semicylindrical housing section
500b second semicylindrical housing section

What is claimed is:

1. A method of use for a separation apparatus that includes a housing having an inlet end, an outlet end, and a separation chamber defined between the inlet and outlet ends, a first inductively-coupled plasma torch assembly being mounted to the housing and having an injection channel in fluid communication with the separation chamber, a second inductively-coupled plasma torch assembly that is disposed around a first section of the housing, first and second magnetic elements that are disposed around second and third sections of the housing, and a plurality of concentric electrodes that are mounted within the outlet end of the housing, the method comprising:
providing a supply of the plasma-forming gas along the injection channel;
ionizing the supply of the plasma-forming gas within the injection channel and within the separation chamber for generating a plasma discharge therewithin;
providing a liquid supply of high-level nuclear waste along the injection channel, together with the supply of the plasma-forming gas; and
generating a magnetic field that is substantially parallel to a longitudinal axis of the separation chamber and an electric field that is perpendicular to the magnetic field such that the supply of high-level nuclear waste is separated into a high-mass portion of the supply of high-level nuclear waste and a low-mass portion of the supply of high-level nuclear waste;
wherein an inner surface of at least one of the first, second and third sections of the housing includes at least one first outlet aperture;
wherein one of the plurality of concentric electrodes defines a second outlet aperture; and
wherein the supply of high-level nuclear waste is separated such that the high-mass portion of the supply of high-level nuclear waste is ejected radially outwards towards the at least one first outlet aperture and the low-mass portion of the liquid supply high-level nuclear waste is directed along the separation chamber, towards the second outlet aperture.

2. The method according to claim 1, further comprising providing at least one igniter element within the injection channel and within the separation chamber, prior to the step of providing the supply of the plasma-forming gas along the injection channel.

3. The method according to claim 1, wherein the step of ionizing the supply of the plasma-forming gas within the injection channel and within the separation chamber includes energizing each of the first and second inductively-coupled plasma torches.

4. The method according to claim 3, wherein the step of generating the magnetic field that is substantially parallel to a longitudinal axis of the separation chamber and an electric field that is perpendicular to the magnetic field includes energizing each of the first and second magnetic elements and the plurality of concentric electrodes.

5. The method according to claim 4, wherein each of the first and second magnetic elements and plurality of concentric electrodes are energized such that when the plasma discharge and the liquid supply of high-level nuclear waste is injected into the separation chamber, the high-mass portion of the liquid supply of high-level nuclear waste is ejected radially outwards towards the at least one first outlet aperture, and the low-mass portion of the liquid supply high-level nuclear waste is directed along the longitudinal axis of the separation chamber, towards the second outlet aperture.

6. The method according to claim 4, wherein the first and second magnetic elements are first and second electromagnets.

7. The method according to claim 4, wherein the first and second magnetic elements are first and second permanent magnets.

8. The method according to claim 3, wherein second inductively-coupled plasma torch assembly includes an rf coil that is circumferentially disposed around the first section of the housing.

9. The method according to claim 1, wherein the inlet and outlet ends of the housing each including a through-opening in fluid communication with the separation chamber.

10. The method according to claim 4, wherein the separation chamber is a cylindrical separation chamber, wherein the first second and third sections of the housing are first second and third axial housing sections which each surround a portion of the cylindrical separation chamber, and where the second and third axial housing sections are disposed on either side of the first axial housing.

11. The method according to claim 10, wherein the second and third axial housing sections are composed of a conductive material, and wherein the first axial housing section is composed of an electrically insulating material.

12. The method according to claim 10, wherein an inner diameter of the first axial housing section is less than an inner diameter of each of the second axial housing section and the third axial housing sections.

13. The method according to claim 1, wherein the first inductively-coupled plasma torch includes:
- a tubular torch body; and
- a pair of concentrically disposed injection tubes mounted within the injection channel of the first the first inductively-coupled plasma torch, the pair of concentrically disposed injection tubes including an outer injection tube that extends from the inlet end along a length of the injection channel and an inner injection tube that is structured as a nebulizing element.

* * * * *